(12) United States Patent
Yin et al.

(10) Patent No.: US 12,192,663 B2
(45) Date of Patent: Jan. 7, 2025

(54) IMAGE SENSOR, LEVEL SHIFTER CIRCUIT, AND OPERATION METHOD THEREOF

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Jia-Sian Lyu, Pingtung County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 153 days.

(21) Appl. No.: 18/300,363

(22) Filed: Apr. 13, 2023

(65) Prior Publication Data
US 2023/0370067 A1 Nov. 16, 2023

Related U.S. Application Data

(60) Provisional application No. 63/341,423, filed on May 13, 2022.

(51) Int. Cl.
*H04N 25/78* (2023.01)
*G06F 1/08* (2006.01)
(Continued)

(52) U.S. Cl.
CPC ............. *H04N 25/78* (2023.01); *G06F 1/08* (2013.01); *H01L 25/0753* (2013.01);
(Continued)

(58) Field of Classification Search
CPC ...... H04N 25/78; H04N 25/60; H04N 25/627; H04N 25/709; H04N 25/77; H04N 25/772; H04N 25/778; H04N 25/7795; H04N 25/779; H01L 25/0753; H01L 25/18; H01L 27/14612; H01L 27/14636; H03L 7/099; H03K 19/018521; G06F 1/08
See application file for complete search history.

(56) References Cited

U.S. PATENT DOCUMENTS 6,166,969 A * 12/2000 Song ............... H03K 19/018521
365/189.11
9,337,818 B1 * 5/2016 Thakur .......... H03K 19/018521
(Continued)

*Primary Examiner* — Twyler L Haskins
*Assistant Examiner* — John H Morehead, III
(74) *Attorney, Agent, or Firm* — JCIPRNET

(57) ABSTRACT

An image sensor, a level shifter circuit, and an operation method thereof are provided. The image sensor includes a pixel circuit and a pixel driving circuit. The pixel driving circuit includes first, second, third, fourth, fifth, and sixth transistors. A first terminal of the first transistor is coupled to a first voltage. A first terminal of the second transistor is coupled to the first voltage, and a control terminal of the second transistor is coupled to a control terminal of the first transistor and a second terminal of the first transistor. A first terminal of the third transistor is coupled to the second terminal of the first transistor, and a second terminal of the third transistor is coupled to a ground voltage. A first terminal of the fourth transistor is coupled to a second terminal of the second transistor and an output terminal.

19 Claims, 9 Drawing Sheets

(51) Int. Cl.
   *H01L 25/075*      (2006.01)
   *H01L 25/18*       (2023.01)
   *H01L 27/146*      (2006.01)
   *H03K 19/0185*     (2006.01)
   *H03L 7/099*       (2006.01)
   *H04N 25/60*       (2023.01)
   *H04N 25/627*      (2023.01)
   *H04N 25/63*       (2023.01)
   *H04N 25/709*      (2023.01)
   *H04N 25/76*       (2023.01)
   *H04N 25/77*       (2023.01)
   *H04N 25/772*      (2023.01)
   *H04N 25/778*      (2023.01)

(52) U.S. Cl.
   CPC ........ *H01L 25/18* (2013.01); *H01L 27/14612* (2013.01); *H01L 27/14632* (2013.01); *H01L 27/14636* (2013.01); *H03K 19/018521* (2013.01); *H03L 7/099* (2013.01); *H04N 25/60* (2023.01); *H04N 25/627* (2023.01); *H04N 25/63* (2023.01); *H04N 25/709* (2023.01); *H04N 25/77* (2023.01); *H04N 25/772* (2023.01); *H04N 25/778* (2023.01); *H04N 25/7795* (2023.01)

(56) References Cited

U.S. PATENT DOCUMENTS

| | | | |
|---|---|---|---|
| 10,211,834 B1* | 2/2019 | Lee | H03K 19/018521 |
| 2007/0279093 A1* | 12/2007 | Senda | H03K 19/018521 |
| | | | 326/81 |
| 2021/0160448 A1* | 5/2021 | Seo | H01L 27/14621 |
| 2021/0266484 A1* | 8/2021 | Kobayashi | B60R 16/0231 |
| 2022/0103776 A1* | 3/2022 | Prathipati | H03F 3/45264 |
| 2022/0286636 A1* | 9/2022 | Seo | H04N 25/74 |
| 2022/0415952 A1* | 12/2022 | Hwang | H04N 25/47 |

* cited by examiner

IMAGE SENSOR, LEVEL SHIFTER CIRCUIT, AND OPERATION METHOD THEREOF

CROSS-REFERENCE TO RELATED APPLICATION

This application claims the priority benefit of U.S. provisional application Ser. No. 63/341,423, filed on May 13, 2022. The entirety of the above-mentioned patent application is hereby incorporated by reference herein and made a part of this specification.

BACKGROUND

Technical Field

The disclosure relates to a sensing technology, and in particular to an image sensor, a level shifter circuit, and an operation method thereof.

Description of Related Art

Generally speaking, the pixel driving circuit of the traditional image sensor usually requires a two-stage level shifter to implement the driving signal with a voltage swing from a positive voltage potential to a negative voltage potential. Therefore, the pixel driving circuit of the traditional image sensor requires more circuit elements and occupies a huge circuit layout area.

SUMMARY

The disclosure provides an image sensor, a level shifter circuit, and an operation method thereof, which can effectively drive a pixel circuit.

An image sensor of the disclosure includes a pixel circuit and a pixel driving circuit. The pixel driving circuit is coupled to the pixel circuit. The pixel driving circuit includes a first transistor, a second transistor, a third transistor, a fourth transistor, a fifth transistor, and a sixth transistor. A first terminal of the first transistor is coupled to a first voltage. A first terminal of the second transistor is coupled to the first voltage, and a control terminal of the second transistor is coupled to a control terminal of the first transistor and a second terminal of the first transistor. A first terminal of the third transistor is coupled to the second terminal of the first transistor, and a second terminal of the third transistor is coupled to a ground voltage. A first terminal of the fourth transistor is coupled to a second terminal of the second transistor and an output terminal. A first terminal of the fifth transistor is coupled to a second terminal of the fourth transistor, and a second terminal of the fifth transistor is coupled to a second voltage. A first terminal of the sixth transistor is coupled to the second terminal of the fourth transistor, and a second terminal of the sixth transistor is coupled to the ground voltage. The output terminal is coupled to the pixel circuit, and the output terminal outputs a driving signal to the pixel circuit.

A level shifter circuit of the disclosure includes a first transistor, a second transistor, a third transistor, a fourth transistor, a fifth transistor, and a sixth transistor. A first terminal of the first transistor is coupled to a first voltage. A first terminal of the second transistor is coupled to the first voltage, and a control terminal of the second transistor is coupled to a control terminal of the first transistor and a second terminal of the first transistor. A first terminal of the third transistor is coupled to the second terminal of the first transistor, and a second terminal of the third transistor is coupled to a ground voltage. A first terminal of the fourth transistor is coupled to a second terminal of the second transistor and an output terminal. A first terminal of the fifth transistor is coupled to a second terminal of the fourth transistor, and a second terminal of the fifth transistor is coupled to a second voltage. A first terminal of the sixth transistor is coupled to the second terminal of the fourth transistor, and a second terminal of the sixth transistor is coupled to the ground voltage. The output terminal is coupled to the pixel circuit, and the output terminal outputs a driving signal to the pixel circuit. The first voltage is greater than the ground voltage, and the second voltage is less than the ground voltage. The first transistor and the second transistor are P-type transistors. The third transistor, the fourth transistor, the fifth transistor, and the sixth transistor are N-type transistors. A control terminal of the third transistor receives a first enabling signal provided by a timing controller, and a control terminal of the fourth transistor receives a second enabling signal provided by the timing controller. A signal waveform of the first enabling signal is inverted to a signal waveform of the second enabling signal, and swings of the first enabling signal and the second enabling signal are from the ground voltage to a third voltage. The third voltage is less than the first voltage.

An operation method of the disclosure is applicable to an image sensor. The image sensor includes a timing controller, a potential dropper, a pixel circuit, and a pixel driving circuit. The pixel driving circuit includes a first transistor, a second transistor, a third transistor, a fourth transistor, a fifth transistor, and a sixth transistor. The operation method includes the following steps. A first enabling signal is provided to a control terminal of the third transistor, and a second enabling signal is provided to a control terminal of the fourth transistor by the timing controller. A signal waveform of the first enabling signal is inverted to a signal waveform of the second enabling signal. A first control signal is provided to a control terminal of the fifth transistor, and a second control signal is provided to a control terminal of the sixth transistor by the potential dropper. A signal waveform of the first control signal is inverted to a signal waveform of the second control signal. A driving signal is output to the pixel circuit by an output terminal coupled to a first terminal of the fourth transistor.

Based on the above, the image sensor, the level shifter circuit, and the operation method thereof of the disclosure can generate the driving signal with a voltage swing from a positive voltage potential to a negative voltage potential and can implement the pixel driving circuit requiring fewer transistors to effectively reduce the circuit layout area of the pixel driving circuit.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
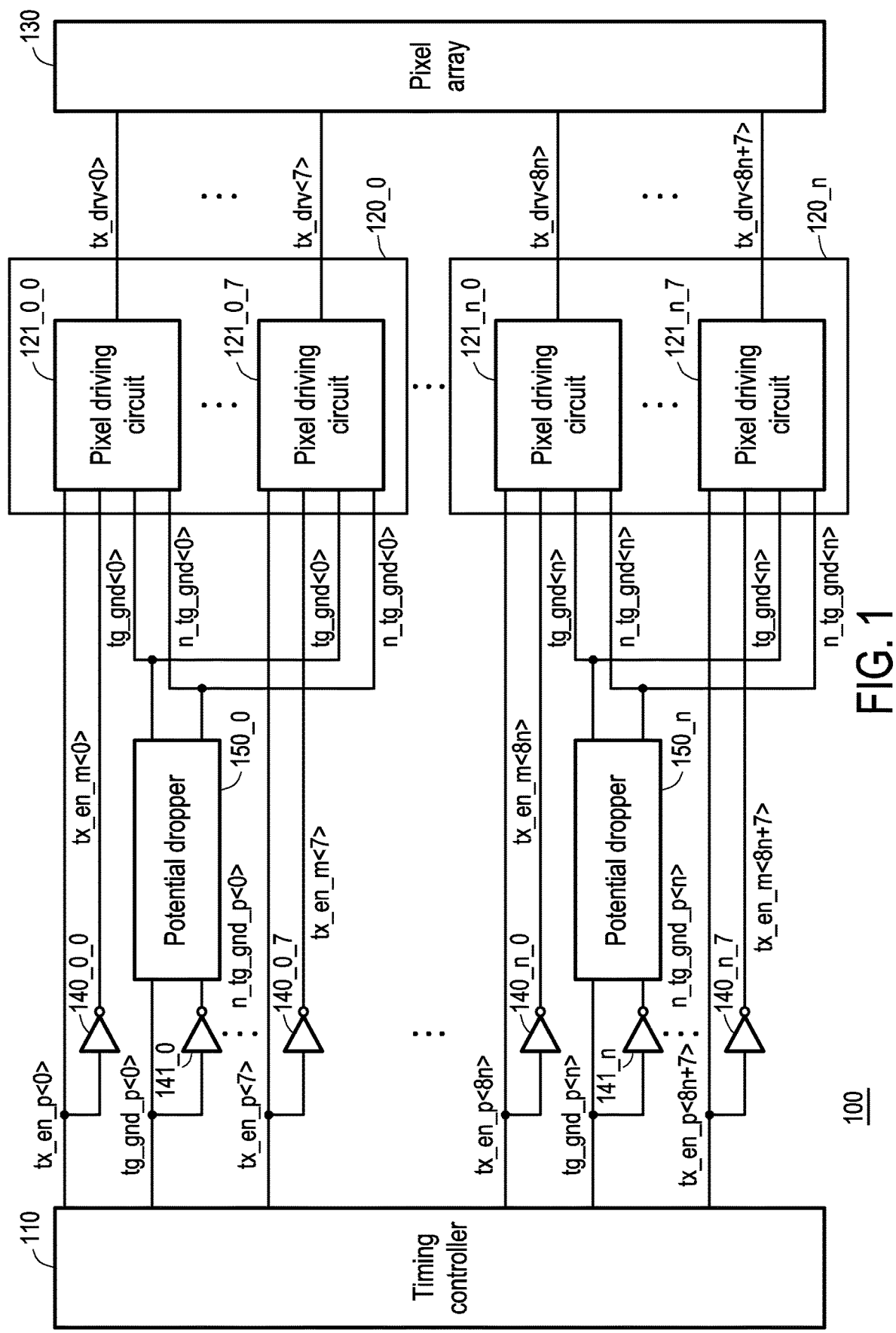
FIG. 1 is a schematic circuit diagram of an image sensor according to an embodiment of the disclosure.

In order for the content of the disclosure to be more comprehensible, the following specific embodiments are given as examples according to which the disclosure can indeed be implemented. In addition, wherever possible, elements/components/steps using the same reference numerals in the drawings and the embodiments represent the same or similar parts.

FIG. 1 is a schematic circuit diagram of an image sensor according to an embodiment of the disclosure. Referring to FIG. 1, the image sensor includes a timing controller 110, multiple pixel driving circuit groups 120_1 to 120_$n$, a pixel array 130, multiple inverters 140_0_0 to 140_0_7 and 141_0 to 141_$n$, and multiple potential droppers 150_0 to 150_$n$, where n is an integer greater than or equal to 0. The pixel driving circuit group 120_1 includes pixel driving circuits 121_0_0 to 121_0_7. The number of pixel driving circuits of one pixel driving circuit group may be 8. By analogy, the pixel driving circuit group 120_$n$ includes pixel driving circuits 121_$n$_0 to 121_$n$_7. In the embodiment, the timing controller 110 is coupled to the pixel driving circuits 121_0_0 to 121_0_7, the inverters 140_0_0 to 140_0_7 and 141_0 to 141_$n$, and the potential droppers 150_0 to 150_$n$ through multiple signal lines. The pixel driving circuits 121_0_0 to 121_0_7 are respectively coupled to multiple pixel circuits in the pixel array 130 to drive the pixel circuits.

In the embodiment, the timing controller 110 outputs multiple first enabling signals tx_en_p<0> to tx_en_p<8n+7> to the pixel driving circuits 121_0_0 to 121_$n$_7 through multiple signal lines, and outputs multiple second enabling signals tx_en_m<0> to tx_en_m<8n+7> to the pixel driving circuits 121_0_0 to 121_$n$_7 by the inverters 140_0_0 to 140_0_7. In the embodiment, the timing controller 110 also outputs multiple first original control signals tg_gnd_p<0> to tg_gnd_p<n> to the potential droppers 150_0 to 150_$n$ through other signal lines, and also outputs multiple second original control signals n_tg_gnd_p<0> to n_tg_gnd_p<n> to the potential droppers 150_0 to 150_$n$ by the inverters 141_0 to 141_$n$.

In the embodiment, the potential droppers 150_0 to 150_$n$ may generate multiple first control signals tg_gnd<0> to tg_gnd<n> and multiple second control signals n_tg_gnd<0> to n_tg_gnd<n> to the pixel driving circuits 121_0_0 to 121_$n$_7 according to the first original control signals tg_gnd_p<0> to tg_gnd_p<n> and the second original control signals n_tg_gnd_p<0> to n_tg_gnd_p<n>. Signal waveforms of the first control signals tg_gnd_p<0> to tg_gnd_p<n> are respectively inverted to signal waveforms of the corresponding second control signals n_tg_gnd_p<0> to n_tg_gnd_p<n>. In the embodiment, each of the potential droppers 150_0 to 150_$n$ may be coupled to multiple pixel driving circuits. Taking the potential dropper 150_0 as an example, the potential dropper 150_0 may provide the first control signal tg_gnd<0> and the second control signal n_tg_gnd<0> to the pixel driving circuits 121_0_0 to 121_0_7.

In the embodiment, the pixel driving circuits 121_0_0 to 121_$n$_7 may generate driving signals tx_drv<0> to tx_drv<8n+7> according to the first enabling signals tx_en_p<0> to tx_en_p<7>, the second enabling signals tx_en_m<0> to tx_en_m<7>, the first control signals tg_gnd_p<0> to tg_gnd_p<n>, and the second control signals n_tg_gnd_p<0> to n_tg_gnd_p<n>, and output the driving signals tx_drv<0> to tx_drv<8n+7> to the pixel circuits in the pixel array 130 to drive the pixel circuits in the pixel array 130.

Taking the pixel driving circuit 121_0_0 as an example, the timing controller 110 outputs the first enabling signal tx_en_p<0> to the pixel driving circuit 121_0_0, and outputs the second enabling signal tx_en_m<0> to the pixel driving circuit 121_0_0 by the inverter 140_0_0. The timing controller 110 also outputs the first original control signal tg_gnd_p<0> to the potential dropper 150_0, and also outputs the second original control signal n_tg_gnd_p<0> to the potential dropper 150_0 by the inverter 141_0. The potential droppers 150_0 to 150_$n$ may generate the first control signal tg_gnd<0> and the second control signal n_tg_gnd<0> to the pixel driving circuit 121_0_0 according to the first original control signal tg_gnd_p<0> and the second original control signal n_tg_gnd_p<0>. Therefore, the pixel driving circuit 121_0_0 may generate the driving signal tx_drv<0> according to the first enabling signal tx_en_p<0>, the second enabling signal tx_en_m<0>, the first control signal tg_gnd_p<0>, and the second control signal n_tg_gnd_p<0>, and output the driving signal tx_drv<0> to the pixel circuit in the pixel array 130 to drive the pixel circuit in the pixel array 130.

Figure 2:
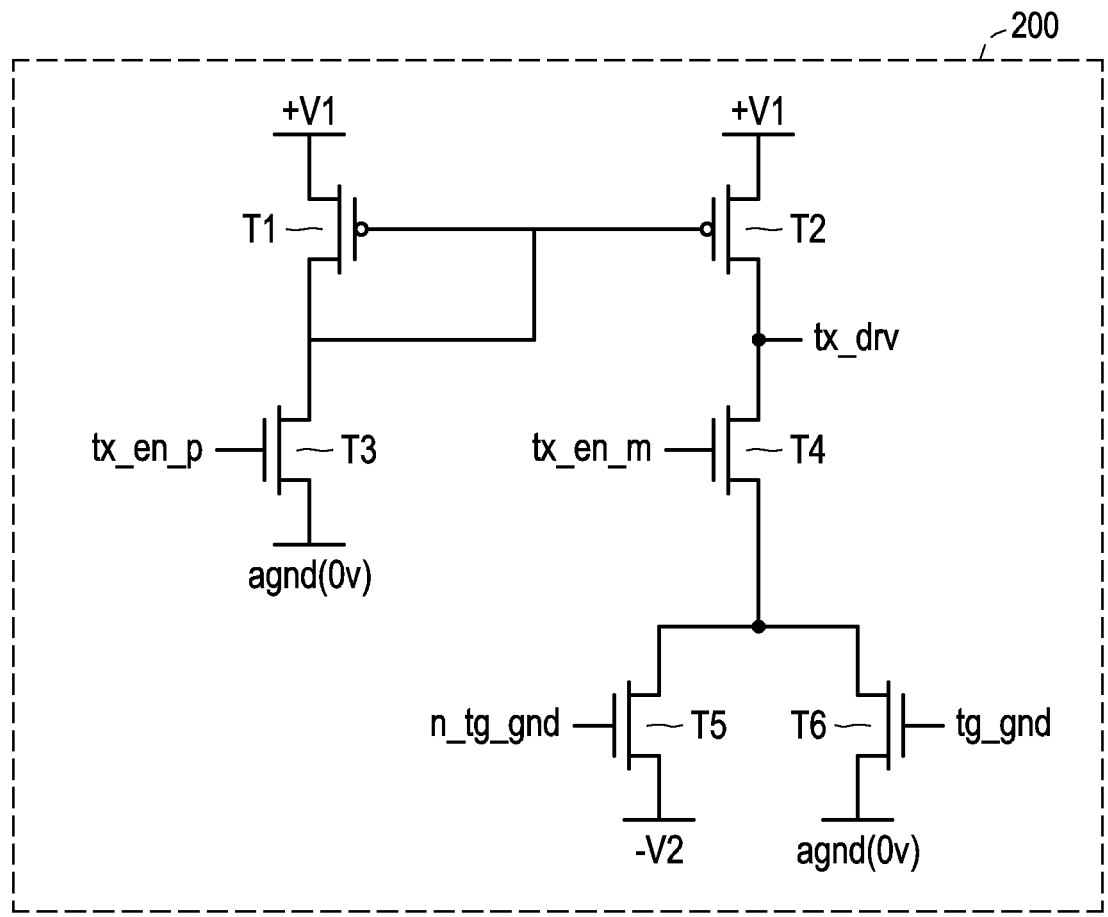
FIG. 2 is a schematic circuit diagram of a pixel driving circuit according to an embodiment of the disclosure.

FIG. 2 is a schematic circuit diagram of a pixel driving circuit according to an embodiment of the disclosure. Referring to FIG. 2, the pixel driving circuit of the disclosure may be implemented as a pixel driving circuit 200 shown in FIG. 2. In the embodiment, the pixel driving circuit 200 may be a level shifter circuit. The pixel driving circuit 200 includes a first transistor T1, a second transistor T2, a third transistor T3, a fourth transistor T4, a fifth transistor T5, and a sixth transistor T6. A first terminal of the first transistor T1 is coupled to a first voltage +V1 (for example, +4 volts (V)). A control terminal of the first transistor T1 is coupled to a second terminal of the first transistor T1. A first terminal of the second transistor T2 is coupled to the first voltage +V1, and a control terminal of the second transistor T2 is coupled to the control terminal of the first transistor T1 and the second terminal of the first transistor T1. A first terminal of the third transistor T3 is coupled to the second terminal of the first transistor T1, and a second terminal of the third transistor T3 is coupled to a ground voltage agnd (for example, 0V). A first terminal of the fourth transistor T4 is coupled to a second terminal of the second transistor T2 and an output terminal of the pixel driving circuit 200. A first terminal of the fifth transistor T5 is coupled to a second terminal of the fourth transistor T4, and a second terminal of the fifth transistor T5 is coupled to a second voltage −V2 (for example, −1.2V). A first terminal of the sixth transistor T6 is coupled to the second terminal of the fourth transistor T4. A second terminal of the sixth transistor T6 is coupled to the ground voltage agnd. In the embodiment, the output terminal of the pixel driving circuit 200 is coupled to the pixel circuit, and the output terminal outputs a driving signal tx_drv to the pixel circuit.

In the embodiment, the first voltage +V1 may be greater than the ground voltage agnd, and the second voltage −V2 may be less than the ground voltage agnd. In the embodiment, the first transistor T1 and the second transistor T2 are P-type transistors (for example, P-type metal-oxide-semiconductor field-effect transistors (P-type MOSFETs)). The third transistor T3, the fourth transistor T4, the fifth transistor T5, and the sixth transistor T6 are N-type transistors (for example, N-type MOSFETs).

Figure 3:
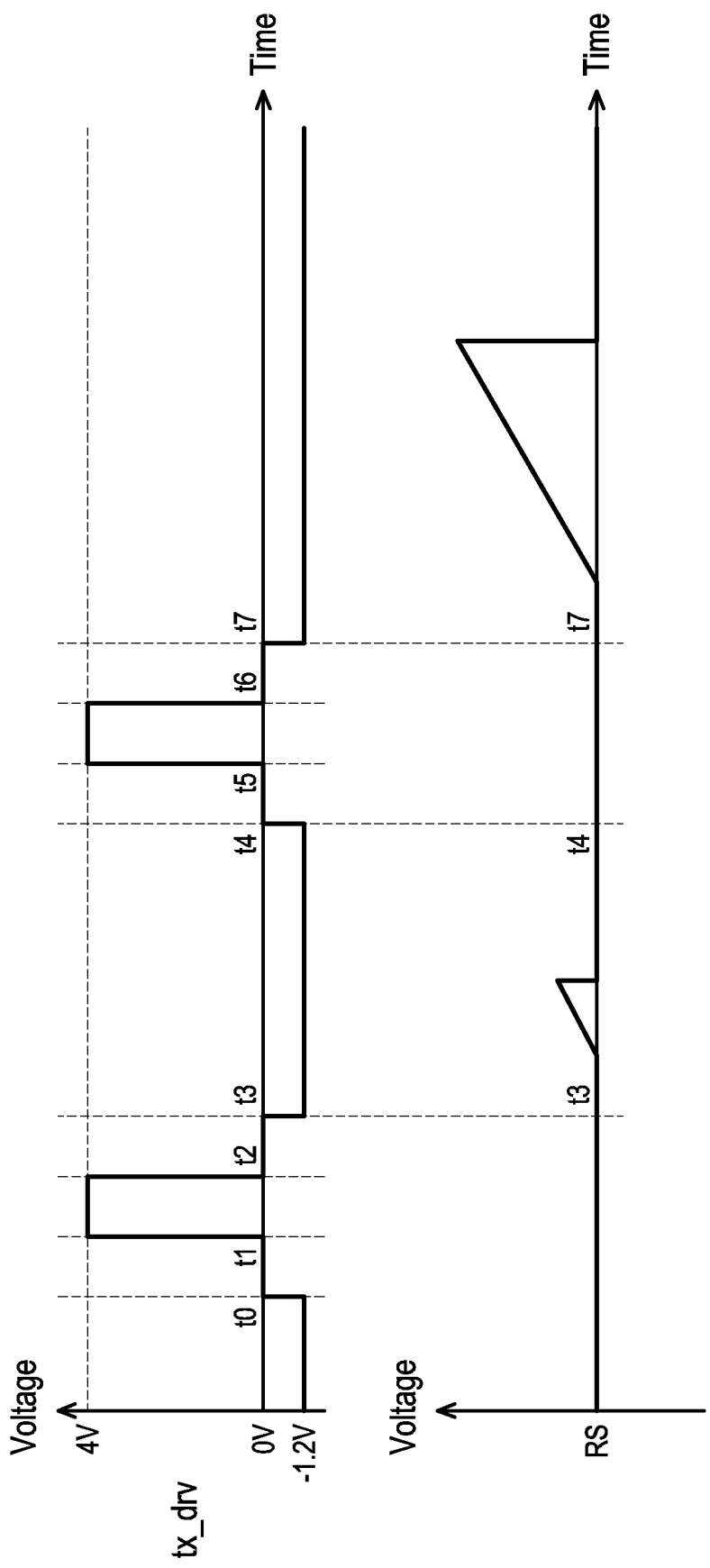
FIG. 3 is a signal timing diagram of a driving signal and a ramp signal according to an embodiment of the disclosure.

FIG. 3 is a signal timing diagram of a driving signal and a ramp signal according to an embodiment of the disclosure. Referring to FIG. 2 and FIG. 3, in the embodiment, the timing controller of FIG. 1 may provide a first enabling signal tx_en_p to a control terminal of the third transistor T3, and provide a second enabling signal tx_en_m to a control terminal of the fourth transistor T4, wherein a signal waveform of the first enabling signal tx_en_p is inverted to a signal waveform of the second enabling signals tx_en_m. In the embodiment, the potential dropper of FIG. 1 may provide a first control signal tg_gnd to a control terminal of the fifth transistor T5, and provide a second control signal n_tg_gnd to a control terminal of the sixth transistor T6, wherein a signal waveform of the first control signal tg_gnd is inverted to a signal waveform of the second control signal n_tg_gnd. In the embodiment, the pixel driving circuit 200 may generate the driving signal tx_drv shown in FIG. 3 according to the first enabling signal tx_en_p, the second enabling signal tx_en_m, the first control signal tg_gnd, and the second control signal n_tg_gnd. In the embodiment, swings of the first enabling signal tx_en_p and the second enabling signal tx_en_m are from the ground voltage (for example, 0V) to a third voltage. The third voltage is less than the first voltage +V1. In an embodiment, third voltage may, for example, be +1.2 volts (+1.2V).

As shown in FIG. 3, the driving signal includes the same driving waveforms, and the driving waveforms respectively have a second-order voltage change. The second-order voltage change is sequentially a sequential voltage change result of the second voltage (−1.2V), the ground voltage (0V), the first voltage (4V), the ground voltage (0V), and the second voltage (−1.2V). Before time t0, during a period from time t3 to time t4, and after time t7, the driving signal tx_drv is the second voltage (−1.2V). During a period from time t0 to time t1, a period from time t2 to time t3, a period from time t4 to time t5, and a period from time t6 to time t7, the driving signal tx_drv is the ground voltage (0V). During a period from time t1 to time t2 and a period from time t5 to time t6, the driving signal tx_drv is the first voltage (4V).

Figure 4:
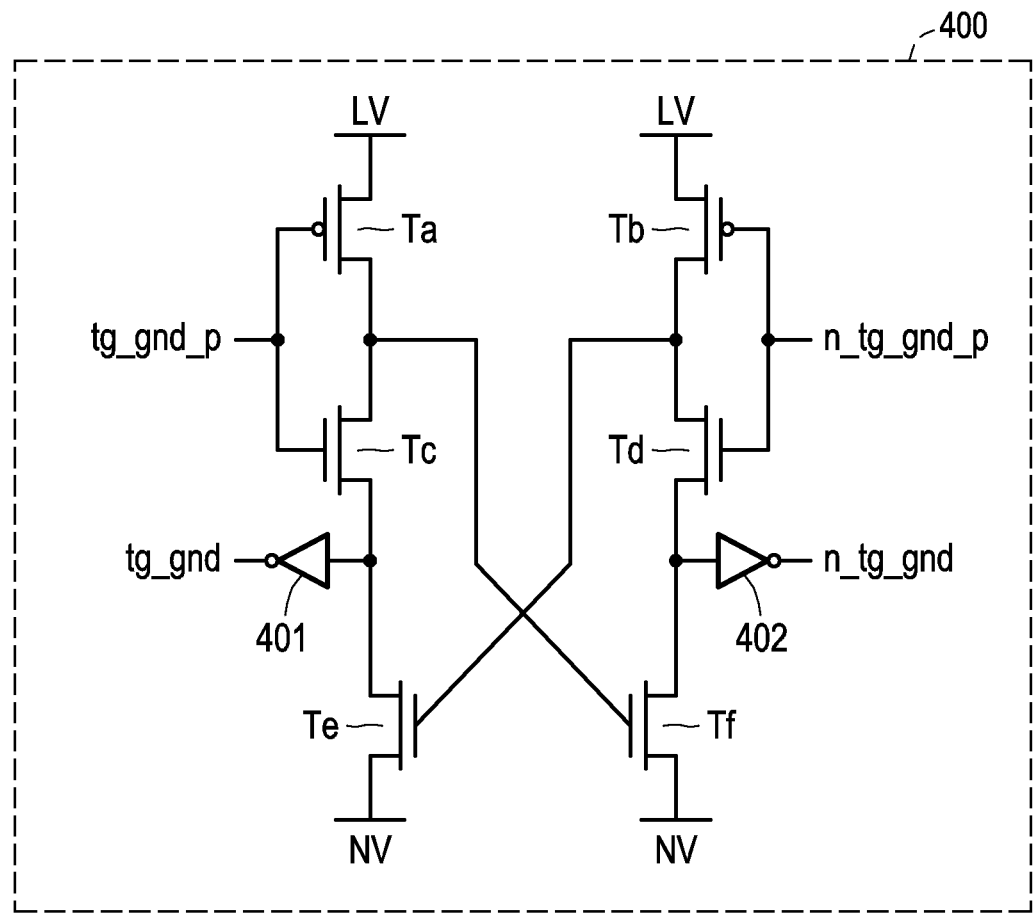
FIG. 4 is a schematic circuit diagram of a potential dropper according to an embodiment of the disclosure.

FIG. 4 is a schematic circuit diagram of a potential dropper according to an embodiment of the disclosure. Referring to FIG. 4, the potential reducer of the embodiment may be implemented as a potential reducer 400 shown in FIG. 4. The potential dropper 400 includes transistors Ta, Tb, Tc, Td, Te, and Tf and inverters 401 and 402. In the embodiment, a first terminal of the transistor Ta is coupled to a reference voltage LV (1.2V) with a low voltage potential. A control terminal of the transistor Ta receives a first original control signal tg_gnd_p. A first terminal of the transistor Tb is coupled to the reference voltage LV (1.2V) with a low voltage potential. A control terminal of the transistor Tb receives a second original control signal n_tg_gnd_p. A control terminal of the transistor Tc receives the first original control signal tg_gnd_p. A first terminal of the transistor Tc is coupled to a second terminal of the transistor Ta. A control terminal of the transistor Td receives the second original control signal n_tg_gnd_p. A first terminal of the transistor Td is coupled to a second terminal of the transistor Tb. A first terminal of the transistor Te is coupled to a second terminal of the transistor Tc. A control terminal of the transistor Te is coupled to the second terminal of the transistor Tb and the first terminal of the transistor Td. A second terminal of the transistor Te is coupled to a negative voltage NV (−1.2V). A first terminal of the transistor Tf is coupled to a second terminal of the transistor Td. A control terminal of the transistor Tf is coupled to the second terminal of the transistor Ta and the first terminal of the transistor Tc. A second terminal of the transistor Tf is coupled to the negative voltage NV (−1.2V). An input terminal of the inverter 401 is coupled to the second terminal of the transistor Tc and the first terminal of the transistor Te. An output terminal of the inverter 401 outputs the first control signal tg_gnd. An input terminal of the inverter 402 is coupled to the second terminal of the transistor Td and the first terminal of the transistor Tf. An output terminal of the inverter 402 outputs the second control signal n_tg_gnd. In the embodiment, the transistor Ta and the transistor Tb are P-type transistors, and the transistors Tc, Td, Te, and Tf are N-type transistors.

Figure 5:
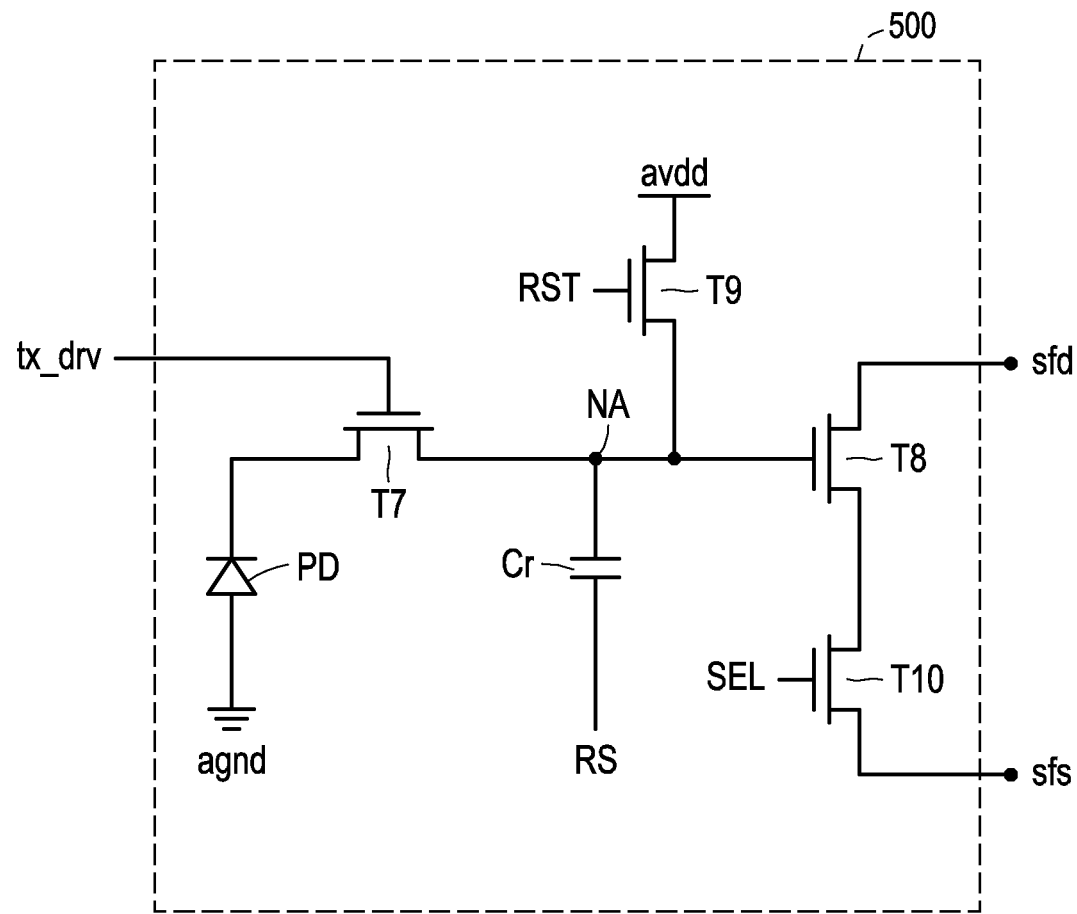
FIG. 5 is a schematic circuit diagram of a pixel circuit according to an embodiment of the disclosure.

FIG. 5 is a schematic circuit diagram of a pixel circuit according to an embodiment of the disclosure. Referring to FIG. 5, the pixel circuit of the disclosure may be implemented as a pixel circuit 500 shown in FIG. 5. The pixel circuit 500 includes a pixel unit PD, a seventh transistor T7 (emission transistor), an eighth transistor T8 (source follower transistor), a ninth transistor T9 (reset transistor), a tenth transistor T10 (selection transistor), and a ramp capacitor Cr. In the embodiment, a first terminal of the seventh transistor T7 is coupled to a terminal of the pixel unit PD, and a control terminal of the seventh transistor T7 is coupled to the output terminal of the pixel driving circuit to receive the driving signal tx_drv. The other terminal of the pixel unit PD is coupled to the ground voltage agnd. A control terminal of the eighth transistor T8 is coupled to a second terminal of the seventh transistor T7 through a floating diffusion (FD) node NA. A first terminal of the eighth transistor T8 is coupled to an input terminal sfd of a comparator. A second terminal of the eighth transistor T8 is also coupled to a first terminal of the tenth transistor T10. A control terminal of the ninth transistor T9 is coupled to a reset signal RST. A second terminal of the ninth transistor T9 is coupled to the second terminal of the seventh transistor T7 through the floating diffusion node NA. A first terminal of the ninth transistor T9 is coupled to an operating voltage avdd. A control terminal of the tenth transistor T10 is coupled to a selection signal SEL. A second terminal of the tenth transistor T10 is coupled to a reference node sfs of the comparator. A terminal of the ramp capacitor Cr is coupled to the second terminal of the seventh transistor T7 through the floating diffusion node NA. The other terminal of the ramp capacitor Cr receives a ramp signal RS. In the embodiment, the pixel unit PD may, for example, be a photodiode. The seventh transistor T7, the eighth transistor T8, and the ninth transistor T9 may respectively be an N-type transistor.

Referring to FIG. 3 and FIG. 5, the pixel circuit 500 may receive the driving signal tx_drv and the ramp signal RS shown in FIG. 3. Before time t0, the driving signal tx_drv is at a negative voltage level (−1.2V) to effectively turn off the seventh transistor T7 to prevent leakage current. During the period from time t0 to time t1, the driving signal tx_drv is at a 0 voltage level to precharge the control terminal of the seventh transistor T7. During the period from time t1 to time t2, the ninth transistor T9 may be turned on according to the reset signal RST (for example, the reset signal RST is switched from a low voltage level to a high voltage level), and the driving signal tx_drv is a 4V pulse signal to quickly turn on the seventh transistor T7 to reset the floating diffusion node NA. Then, during the period from time t2 to time t3, the driving signal tx_drv returns to the 0 voltage level to turn off the seventh transistor T7. During the period from time t3 to time t4, the driving signal tx_drv returns to the negative voltage level (−1.2V), and the ramp signal RS generates a small ramp waveform to read out a reset result (corresponding to a background noise) of the floating diffusion node NA (a voltage signal of the reset result is read out from the input terminal sfd of the comparator).

Then, during the period from time t4 to time t5, the driving signal tx_drv is at the 0 voltage level to precharge the control terminal of the seventh transistor T7. During the period from time t5 to time t6, the driving signal tx_drv is a 4V pulse signal to quickly turn on the seventh transistor T7 to quickly transmit the sensing result of the pixel unit PD to the reset floating diffusion node NA. Then, during the period from time t6 to time t7, the driving signal tx_drv returns to the 0 voltage level to turn off the seventh transistor T7. After time t7, the driving signal tx_drv returns to the negative voltage level (−1.2V), and the tenth transistor T10 may be turned on according to the selection signal SEL (for example, the selection signal SEL is switched from a low voltage level to a high voltage level), and the ramp signal RS generates a large ramp waveform to read out the sensing result of the floating diffusion node NA (the voltage signal of the sensing result is read out from the input terminal sfd of the comparator). In this way, a back-end digital processing circuit may perform background noise removal processing on the sensing result according to the reset result corresponding to the background noise to obtain an accurate sensing result.

Figure 6:
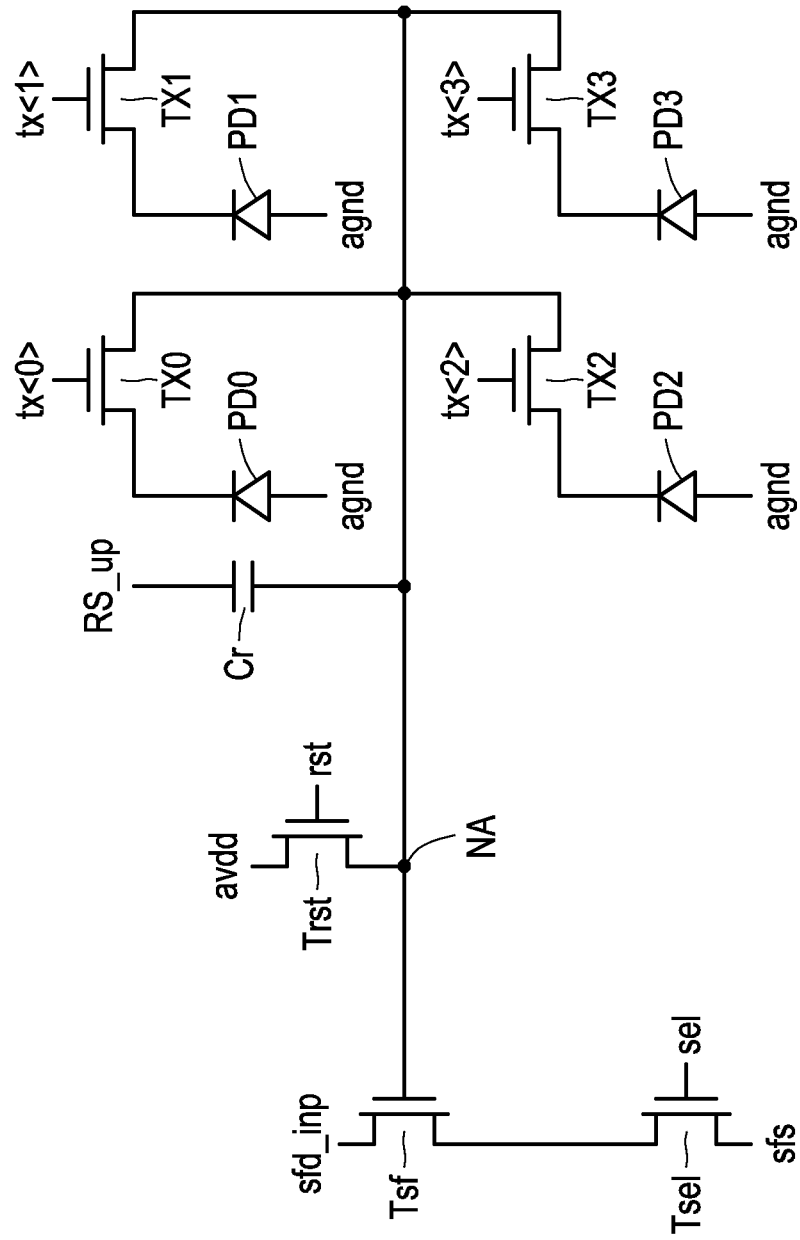
FIG. 6 is a schematic circuit diagram of a pixel circuit according to another embodiment of the disclosure.

FIG. 6 is a schematic circuit diagram of a pixel circuit according to another embodiment of the disclosure. Referring to FIG. 6, the pixel circuit of the disclosure may be implemented as a pixel circuit 600 shown in FIG. 6. The pixel circuit 600 includes multiple pixel units PD0 to PD3, multiple emission transistors TX0 to TX3, the ramp capacitor Cr, a reset transistor Trst, a source follower transistor Tsf, and a selection transistor Tsel. In the embodiment, the pixel units PD0 to PD3 share the same floating diffusion node NA, and functions of the emission transistors TX0 to TX3, the reset transistor Trst, the source follower transistor Tsf, and the ramp capacitor Cr may respectively correspond to those of the seventh transistor T7, the eighth transistor T8, the ninth transistor T9, and the ramp capacitor Cr of the embodiment shown in FIG. 5. The pixel units PD0 to PD3 may, for example, be photodiodes. The emission transistors TX0 to TX3, the reset transistor Trst, the source follower transistor Tsf, and the selection transistor Tsel may respectively be an N-type transistor.

In the embodiment, a first terminal of the source follower transistor Tsf is coupled to a first input terminal sfd_inp of the comparator. A (first terminal) control terminal (gate) of the source follower transistor Tsf is coupled to the floating diffusion node NA. A first terminal of the selection transistor Tsel is coupled to a second terminal of the source follower transistor Tsf. A second terminal of the selection transistor Tsel is coupled to the reference node sfs of the comparator. A control terminal of the selection transistor Tsel receives a selection signal sel. A first terminal of the reset transistor Trst is coupled to the operating voltage avdd. A second terminal of the reset transistor Trst is coupled to the floating diffusion node NA. A control terminal of the reset transistor Trst receives a reset signal rst. The first terminal of the ramp capacitor Cr receives an up ramp signal RS_up. A second terminal of the ramp capacitor Cr is coupled to the floating diffusion node NA. First terminals of the pixel units PD0 to PD3 are coupled to the ground voltage agnd. Second terminals of the pixel units PD0 to PD3 are respectively coupled to first terminals of the emission transistors TX0 to TX3. Second terminals of the emission transistors TX0 to TX3 are coupled to the floating diffusion node NA. Control terminals of the emission transistor TX0 to TX3 respectively receive emission signals tx<0> to tx<3>.

In the embodiment, the emission signals tx<0> to tx<3> may sequentially turn on the emission transistors TX0 to TX3 to sequentially transmit sensing signals of the pixel units PD0 to PD3 to the floating diffusion node NA. When the selection signal sel turns on the selection transistor Tsel, the source follower transistor Tsf may read out the sensing signal stored in the floating diffusion node NA to the first input terminal sfd_inp of the comparator in conjunction with the up ramp signal RS_up provided by the ramp capacitor Cr. In addition, during multiple respective periods when the sensing signals of the pixel units PD0 to PD3 are sequentially read out, the reset signal rst may turn on the reset transistor Trst at intervals to reset a voltage level of the floating diffusion node NA. Therefore, the pixel circuit 600 of the embodiment can effectively save the circuit area of the pixel circuit by the pixel units PD0 to PD3 sharing one floating diffusion node NA.

Figure 7:
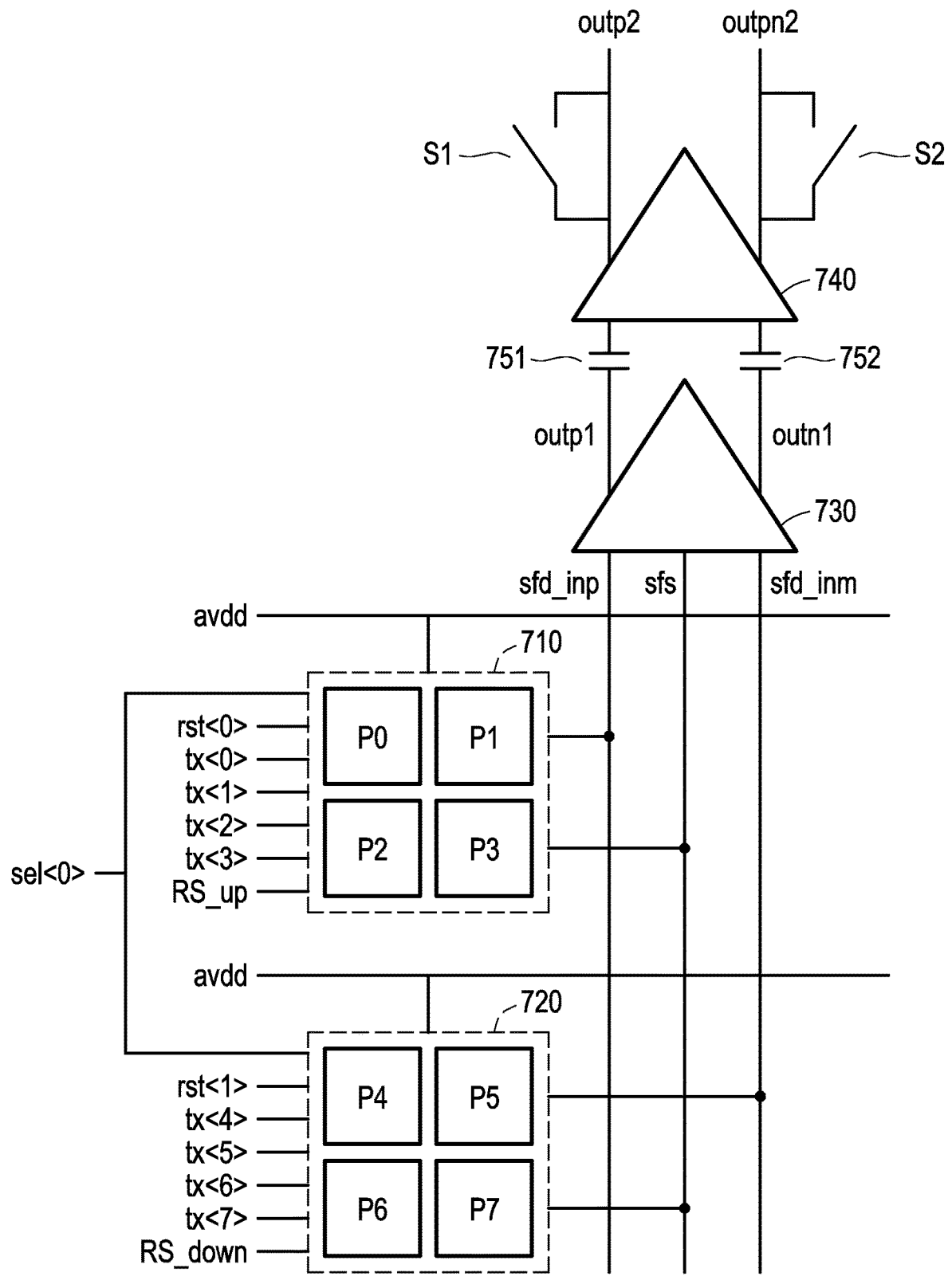
FIG. 7 is a schematic circuit diagram of a pixel circuit according to yet another embodiment of the disclosure.

FIG. 7 is a schematic circuit diagram of a pixel circuit according to yet another embodiment of the disclosure. Referring to FIG. 7, an image sensor 700 includes pixel groups 710 and 720, a (first-stage) differential amplifier 730, a (second-stage) amplifier 740, capacitors 751 and 752, and switches S1 and S2. The pixel group 710 is coupled to a first input terminal (for example, a forward input terminal) sfd_inp and a reference node sfs of the differential amplifier 730. The pixel group 720 is coupled to the reference node sfs and a second input terminal (for example, a reverse input terminal) sfd_inm of the differential amplifier 730. A first output terminal output1 of the differential amplifier 730 is coupled to a first input terminal of the amplifier 740 through the capacitor 751, and a second output terminal output2 of the differential amplifier 730 is coupled to the first input terminal of the amplifier 740 through the capacitor 752. A first output terminal outp2 of the amplifier 740 is coupled to the switch S1, and a second output terminal outn2 of the amplifier 740 is coupled to the switch S2.

In the embodiment, the image sensor 700 adopts a differential correlated double sampling (CDS) circuit architecture. In the embodiment, the pixel group 710 includes pixels P0 to P3, and the pixel group 720 includes pixels P4 to P7. The pixel groups 710 and 720 may respectively implement the circuit of the pixel circuit 600 shown in FIG. 6, and the only difference is that the pixel group 710 receives the up ramp signal RS_up, and the pixel group 720 receives a down ramp signal RS_dow. In the embodiment, the pixel group 710 may receive a selection signal sel<0>, a reset signal rst<0>, emission signals tx<0> to tx<3>, and the up ramp signal RS_up, and receive the operating voltage avdd through a signal line. The pixel group 720 may receive the selection signal sel<0>, a reset signal rst<1>, and emission signals tx<4> to tx<7>, the down ramp signal RS_down, and receive the operating voltage avdd through a signal line.

Figure 8:
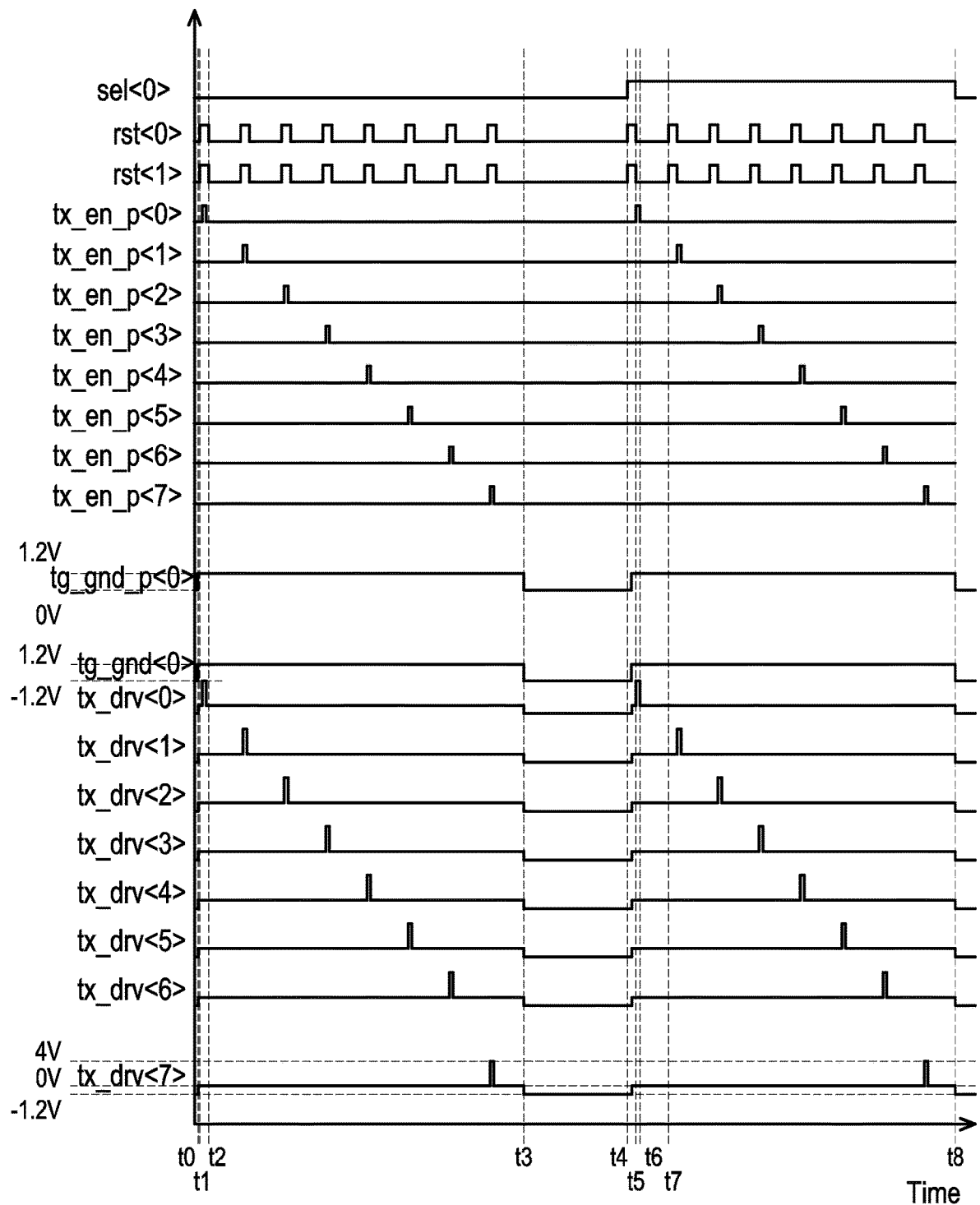
FIG. 8 is a signal timing diagram of multiple signals according to the embodiment of FIG. 7 of the disclosure.

FIG. 8 is a signal timing diagram of multiple signals according to the embodiment of FIG. 7 of the disclosure. Referring to FIG. 7 and FIG. 8, multiple signals of the image sensor 700 of FIG. 7 may implement the signal timing diagram shown in FIG. 8, and reference may also be made to the corresponding embodiment above for the implementation details of each circuit and signal. Firstly, the timing controller provides the first enabling signals tx_en_p<0> to tx_en_p<7> to the pixel driving circuits of the pixels P0 to P7. The first enabling signals tx_en_p<0> to tx_en_p<7> respectively include a pulse signal. The timing controller provides the original control signal tg_gnd_p<0> to the potential dropper, so that the potential dropper generates a control signal tg_gnd<0> to the pixel driving circuits of the pixels P0 to P7. Moreover, the pixel driving circuits of the pixels P0 to P7 may respectively generate the driving signals tx_drv<0> to tx_drv<7>, and provide the driving signals tx_drv<0> to tx_drv<7> to the pixels P0 to P7.

In the embodiment, during a reset period from time t0 to time t4, the selection signal sel<0> is at a low voltage level. Between time t0 and time t3, the original control signal tg_gnd_p<0> provided by the timing controller is switched from a low voltage level of 0V to a high voltage level of 1.2V, and the control signal tg_gnd<0> provided by the potential dropper is switched from a low voltage level of −1.2V to a high voltage level of 1.2V. During the period from time t1 to time t2, the reset signals rst<0> and rst<1> are respectively switched from a low voltage level to a high voltage level. A pulse signal of the first enabling signal tx_en_p<0> also occurs during the period from time t1 to time t2. Moreover, the driving signal tx_drv<0> is switched to a voltage level of 0V, and a pulse signal of the driving signal tx_drv<0> also occurs during the period from time t1 to time t2. A signal waveform relationship of the reset signals rst<0> and rst<1>, the first enabling signals tx_en_p<1> to tx_en_p<7>, and the driving signals tx_drv<0> to tx_drv<7> may be deduced by analogy. In this regard, during the reset period from time t0 to time t4, the pixels P0 to P7 may sequentially perform reset operations.

Then, during a readout period from time t4 to time t8, the selection signal sel<0> is switched to a high voltage level to read out a sensing result. Between time t5 and time t8, the original control signal tg_gnd_p<0> provided by the timing controller is switched from a low voltage level of 0V to a high voltage level of 1.2V, and the control signal tg_gnd<0> provided by the potential dropper is switched from a low voltage level of −1.2V to a high voltage level of 1.2V. During the period from time t4 to time t5, the reset signals rst<0> and rst<1> are respectively switched from a low voltage level to a high voltage level to reset the voltage level of the floating diffusion node. The pulse signal of the first enabling signal tx_en_p<0> occurs during the period from time t5 to time t6. Moreover, the driving signal tx_drv<0> is switched to a voltage level of 4V, and the pulse signal of the driving signal tx_drv<0> occurs during the period from time t5 to time t6. Moreover, the period from time t6 to time t7 may be an analog-to-digital readout period of the back-end digital processing circuit to sequentially read out sensing results of the pixels P0 to P7. The signal waveform relationship of the reset signals rst<0> and rst<1>, the first enabling signals tx_en_p<1> to tx_en_p<7>, and the driving signals tx_drv<1> to tx_drv<7> may be deduced by analogy. In this regard, during the readout period from time t4 to time t8, the sensing results of the pixels P0 to P7 may be sequentially read out. Readout results of the pixels P0-P3 and the pixels P4-P7 may be respectively used as a differential input signal of the differential amplifier 730, so that the back-end digital processing circuit can obtain an accurate signal readout result.

Figure 9:
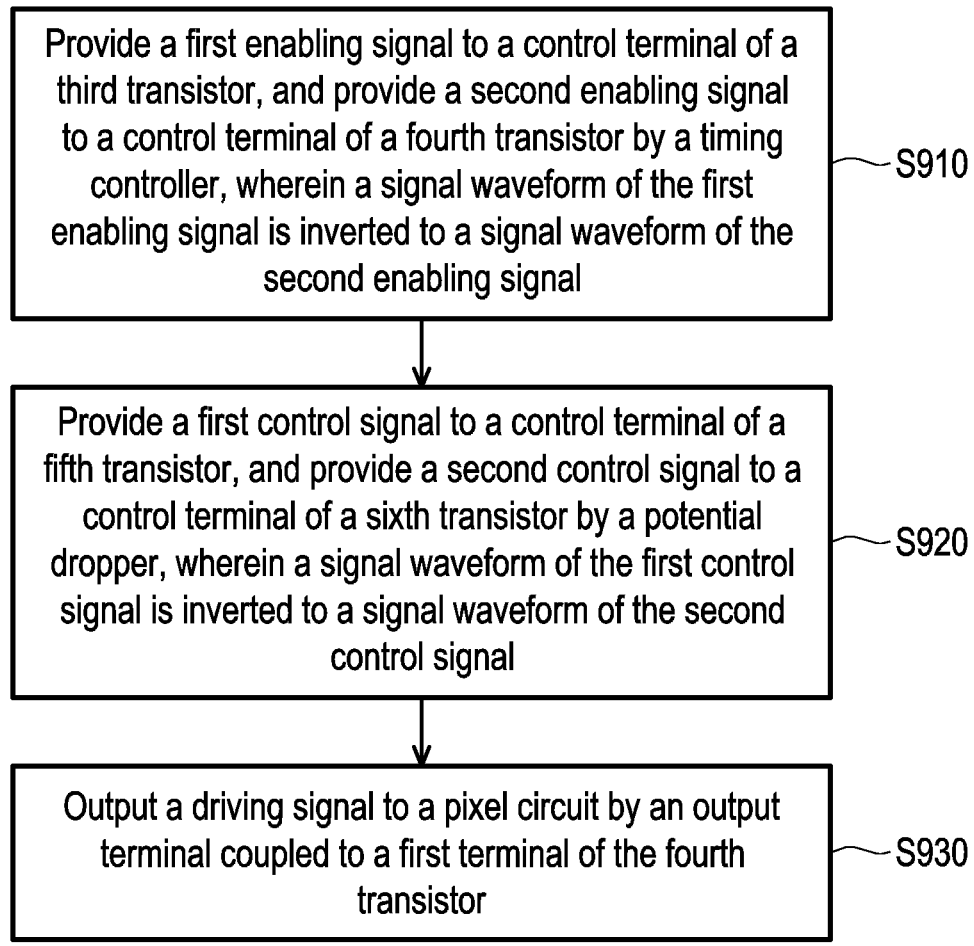
FIG. 9 is a flowchart of an operation method of an image sensor according to an embodiment of the disclosure.

FIG. 9 is a flowchart of an operation method of an image sensor according to an embodiment of the disclosure. Referring to FIG. 1 and FIG. 9, the respective operation methods of the pixel driving circuits 121_0_0 to 121_n_7 of the image sensor 100 may include Steps S910 to S930 below, and the pixel driving circuits 121_0_0 to 121_n_7 may be respectively implemented as the pixel driving circuit 200 shown in FIG. 2. Taking the pixel driving circuit 121_0_0 as an example, in Step S910, the timing controller 110 may provide the first enabling signal tx_en_p<0> to the control terminal of the third transistor (T3), and provide the second enabling signal tx_en_m<0> to the control terminal of the fourth transistor (T4), wherein the signal waveform of the first enabling signal tx_en_p<0> is inverted to the signal waveform of the second enabling signal tx_en_m<0>. In Step S920, the potential dropper 150_0 may provide the first control signal tg_gnd<0> to the control terminal of the fifth transistor (T5), and the second control signal n_tg_gnd<0> to the control terminal of the sixth transistor (T6), wherein the signal waveform of the first control signal tg_gnd<0> is inverted to the signal waveform of the second control signal n_tg_gnd<0>. In Step S930, the output terminal coupled to the first terminal of the fourth transistor (T4) outputs the driving signal to the pixel circuit. Therefore, the operation method of the image sensor of the embodiment may generate the driving signal with a voltage swing from a positive voltage potential to a negative voltage potential to effectively drive the pixel unit.

In addition, reference may be made to the descriptions of the embodiments of FIG. 1 to FIG. 8 for the operation manners and circuit implementation details of other image sensors of the embodiment, and details are not repeated here.

In summary, the image sensor, the level shifter circuit, and the operation method thereof of the disclosure can generate the driving signal with the voltage swing from the positive voltage potential to the negative voltage potential and can implement the pixel driving circuit with fewer transistors (effectively reducing the number of potential converters and transistors) to effectively prevent light banding in an image output by the image sensor (that is, when the pixel array of the image sensor is illuminated, the image output by the image sensor may produce the phenomenon of distinct stripes). Moreover, since the number of transistors of the pixel driving circuit is reduced, and the driving circuit area occupied on an entire image sensor chip can be effectively reduced, the image sensor of the disclosure can reduce the layout area of the pixel driving circuit and can effectively save overall power consumption.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:
1. An image sensor, comprising:
a pixel circuit; and
a pixel driving circuit, coupled to the pixel circuit and comprising:
  a first transistor, wherein a first terminal of the first transistor is coupled to a first voltage;
  a second transistor, wherein a first terminal of the second transistor is coupled to the first voltage, and a control terminal of the second transistor is coupled to a control terminal of the first transistor and a second terminal of the first transistor;
  a third transistor, wherein a first terminal of the third transistor is coupled to the second terminal of the first transistor, and a second terminal of the third transistor is coupled to a ground voltage;

a fourth transistor, wherein a first terminal of the fourth transistor is coupled to a second terminal of the second transistor and an output terminal;

a fifth transistor, wherein a first terminal of the fifth transistor is coupled to a second terminal of the fourth transistor, and a second terminal of the fifth transistor is coupled to a second voltage; and a sixth transistor, wherein a first terminal of the sixth transistor is coupled to the second terminal of the fourth transistor, and a second terminal of the sixth transistor is coupled to the ground voltage, wherein the output terminal is coupled to the pixel circuit, and the output terminal outputs a driving signal to the pixel circuit.

2. The image sensor according to claim 1, wherein the first voltage is greater than the ground voltage, and the second voltage is less than the ground voltage.

3. The image sensor according to claim 1, wherein the first transistor and the second transistor are P-type transistors.

4. The image sensor according to claim 1, wherein the third transistor, the fourth transistor, the fifth transistor, and the sixth transistor are N-type transistors.

5. The image sensor according to claim 1, further comprising:

a timing controller, coupled to the pixel driving circuit and configured to provide a first enabling signal to a control terminal of the third transistor, and provide a second enabling signal to a control terminal of the fourth transistor, wherein a signal waveform of the first enabling signal is inverted to a signal waveform of the second enabling signal, swings of the first enabling signal and the second enabling signal are from the ground voltage to a third voltage, and the third voltage is less than the first voltage.

6. The image sensor according to claim 5, further comprising:

a potential dropper, coupled to the pixel driving circuit and the timing controller, and configured to provide a first control signal to a control terminal of the fifth transistor, and provide a second control signal to a control terminal of the sixth transistor, wherein a signal waveform of the first control signal is inverted to a signal waveform of the second control signal.

7. The image sensor according to claim 6, further comprising:

a plurality of pixel driving circuits, coupled to the potential dropper, wherein the potential dropper provides the first control signal and the second control signal to the pixel driving circuits.

8. The image sensor according to claim 7, wherein a number of the pixel driving circuits is 8.

9. The image sensor according to claim 6, wherein the timing controller provides a first original control signal and a second original control signal to the potential dropper, so that the potential dropper generates the first control signal and the second control signal according to the first original control signal and the second original control signal, wherein a signal waveform of the first original control signal is inverted to a signal waveform of the second original control signal, and the signal waveform of the first control signal is inverted to the signal waveform of the second control signal.

10. The image sensor according to claim 5, wherein the first enabling signal comprises a pulse signal.

11. The image sensor according to claim 1, wherein the pixel circuit comprises:

a pixel unit;

a seventh transistor, wherein a first terminal of the seventh transistor is coupled to the pixel unit, and a control terminal of the seventh transistor is coupled to the output terminal of the pixel driving circuit to receive the driving signal;

an eighth transistor, wherein a control terminal of the eighth transistor is coupled to a second terminal of the seventh transistor;

a ninth transistor, wherein a control terminal of the ninth transistor is coupled to a reset signal, and a second terminal of the ninth transistor is coupled to the second terminal of the seventh transistor;

a tenth transistor, wherein a control terminal of the tenth transistor is coupled to a selection signal, and a first terminal of the tenth transistor is coupled to a second terminal of the eighth transistor.

12. The image sensor according to claim 11, wherein the pixel circuit further comprises:

a ramp capacitor, coupled to the second terminal of the seventh transistor.

13. The image sensor according to claim 1, wherein the driving signal comprises a plurality of same driving waveforms, and the driving waveforms respectively have a second-order voltage change.

14. The image sensor according to claim 13, wherein the second-order voltage change is a sequential voltage change result of the second voltage, the ground voltage, the first voltage, the ground voltage, and the second voltage.

15. A level shifter circuit, comprising:

a first transistor, wherein a first terminal of the first transistor is coupled to a first voltage;

a second transistor, wherein a first terminal of the second transistor is coupled to the first voltage, and a control terminal of the second transistor is coupled to a control terminal of the first transistor and a second terminal of the first transistor;

a third transistor, wherein a first terminal of the third transistor is coupled to the second terminal of the first transistor, and a second terminal of the third transistor is coupled to a ground voltage;

a fourth transistor, wherein a first terminal of the fourth transistor is coupled to a second terminal of the second transistor and an output terminal;

a fifth transistor, wherein a first terminal of the fifth transistor is coupled to a second terminal of the fourth transistor, and a second terminal of the fifth transistor is coupled to a second voltage; and a sixth transistor, wherein a first terminal of the sixth transistor is coupled to the second terminal of the fourth transistor, and a second terminal of the sixth transistor is coupled to the ground voltage, wherein the output terminal is coupled to a pixel circuit, and the output terminal outputs a driving signal to the pixel circuit, wherein the first voltage is greater than the ground voltage, the second voltage is less than the ground voltage, the first transistor and the second transistor are P-type transistors, and the third transistor, the fourth transistor, the fifth transistor, and the sixth transistor are N-type transistors, wherein a control terminal of the third transistor receives a first enabling signal provided by a timing controller, and a control terminal of the fourth transistor receives a second enabling signal provided by the timing controller, wherein a signal waveform of the first enabling signal is inverted to a signal waveform of the second enabling signal, swings of the first enabling signal and the second enabling signal are from the ground voltage to a third voltage, and the third voltage is less than the first voltage.

16. An operation method of an image sensor, wherein the image sensor comprises a timing controller, a potential dropper, a pixel circuit, and a pixel driving circuit, and the pixel driving circuit comprises a first transistor, a second transistor, a third transistor, a fourth transistor, a fifth transistor, and a sixth transistor, the operation method comprising:

providing a first enabling signal to a control terminal of the third transistor, and providing a second enabling signal to a control terminal of the fourth transistor by the timing controller, wherein a signal waveform of the first enabling signal is inverted to a signal waveform of the second enabling signal;

providing a first control signal to a control terminal of the fifth transistor, and providing a second control signal to a control terminal of the sixth transistor by the potential dropper, wherein a signal waveform of the first control signal is inverted to a signal waveform of the second control signal; and outputting a driving signal to the pixel circuit by an output terminal coupled to a first terminal of the fourth transistor.

17. The operation method according to claim 16, further comprising:

providing a first original control signal and a second original control signal to the potential dropper by the timing controller; and generating the first control signal and the second control signal according to the first original control signal and the second original control signal by the potential dropper, wherein a signal waveform of the first original control signal is inverted to a signal waveform of the second original control signal, and the signal waveform of the first control signal is inverted to the signal waveform of the second control signal.

18. The operation method according to claim 16, wherein the driving signal comprises a plurality of same driving waveforms, and the driving waveforms respectively have a second-order voltage change.

19. The operation method according to claim 16, wherein the second-order voltage change is a sequential voltage change result of the second voltage, the ground voltage, the first voltage, the ground voltage, and the second voltage.

* * * * *